US008945987B2

(12) United States Patent  
Crisp et al.

(10) Patent No.: US 8,945,987 B2  
(45) Date of Patent: Feb. 3, 2015

(54) MANUFACTURE OF FACE-DOWN MICROELECTRONIC PACKAGES

(71) Applicant: Invensas Corporation, San Jose, CA (US)

(72) Inventors: Richard Dewitt Crisp, Hornitos, CA (US); Wael Zohni, San Jose, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/837,724

(22) Filed: Mar. 15, 2013

(65) Prior Publication Data

US 2014/0273346 A1  Sep. 18, 2014

(51) Int. Cl.
- *H01L 23/02* (2006.01)
- *H01L 23/52* (2006.01)
- *H01L 25/00* (2006.01)

(52) U.S. Cl.
CPC ..................................... *H01L 25/50* (2013.01)
USPC ............ 438/113; 438/109; 257/686; 257/777

(58) Field of Classification Search
CPC .............. H01L 21/6835; H01L 23/481; H01L 23/49827; H01L 24/32; H01L 24/45; H01L 24/48; H01L 24/49; H01L 24/83; H01L 24/85; H01L 24/86; H01L 25/50; H01L 25/657; H01L 25/74; H01L 2224/48227

See application file for complete search history.

(56) References Cited

U.S. PATENT DOCUMENTS

| | | | |
|---|---|---|---|
| 2006/0012018 A1* | 1/2006 | Karnezos et al. | 257/678 |
| 2008/0251938 A1* | 10/2008 | Wang et al. | 257/777 |
| 2013/0015591 A1* | 1/2013 | Haba et al. | 257/778 |

* cited by examiner

*Primary Examiner* — Zandra Smith  
*Assistant Examiner* — Pamela E Perkins  
(74) *Attorney, Agent, or Firm* — Lerner, David, Littenberg, Krumholz & Mentlik, LLP

(57) ABSTRACT

In a high volume method for manufacturing a microelectronic package, a spacer element and a first die, i.e., microelectronic element, can be attached face-down to a surface of a substrate, contacts on the first die facing a first through opening of the substrate. Then, a second die can be attached face-down atop the first die and the spacer element, contacts on the second die disposed beyond an edge of the first die and facing a second through opening in the substrate. Electrical connections can then be formed between each of the first and second dies and the substrate. The first and second dies can be transferred from positions of a single diced wafer which are selected to maximize compound speed bin yield of the microelectronic package.

28 Claims, 14 Drawing Sheets

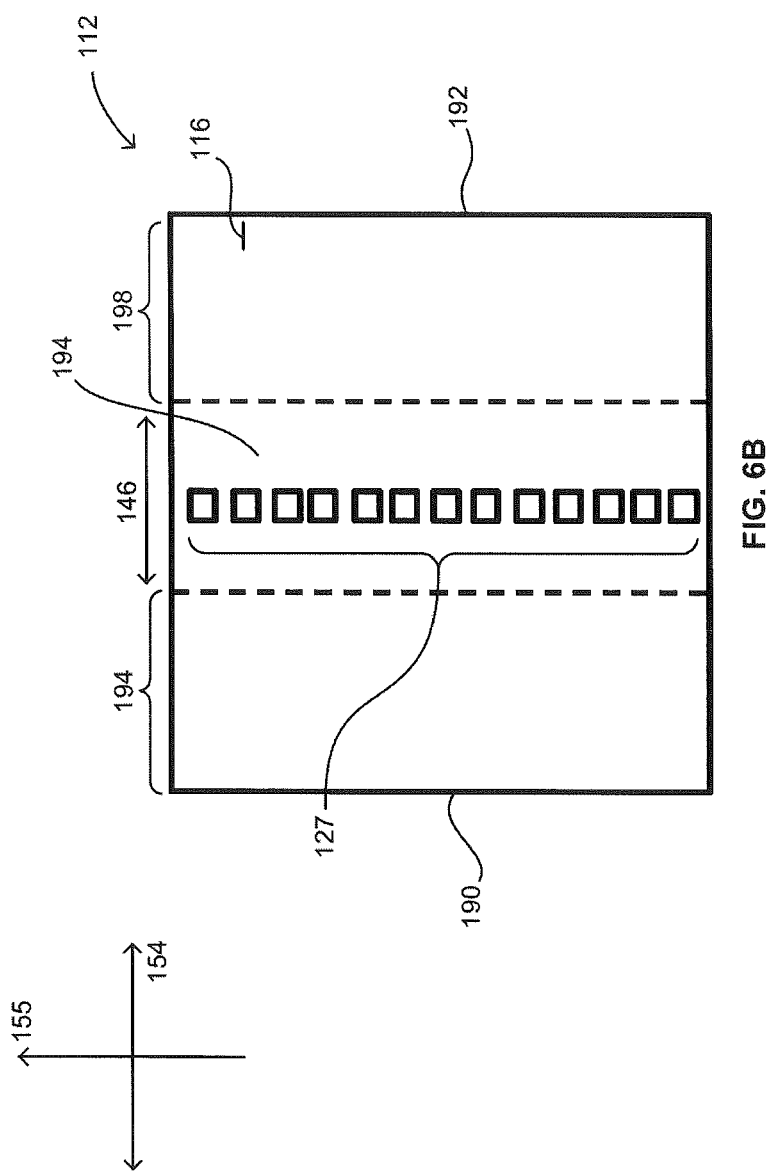

MANUFACTURE OF FACE-DOWN MICROELECTRONIC PACKAGES

BACKGROUND OF THE INVENTION

1. Field of the Invention

The present invention relates to a method of manufacturing a microelectronic package, particularly a microelectronic package incorporating two or more microelectronic elements, e.g., semiconductor chips, especially in a face-down orientation relative to a dielectric element or package substrate.

2. Description of the Related Art

Semiconductor chips are thin flat bodies incorporating a semiconductor device region over which wiring layers are provided in dielectric layers overlying the semiconductor device region and on which contacts at a face of the semiconductor chip are typically provided above the wiring layers and the device region. As used in this disclosure with reference to a component such as a dielectric element or other component such as a semiconductor chip having dielectric material at a surface thereof, a statement that an electrically conductive element is "at" a surface of the component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a component may project from such surface; may be flush with such surface; or may be recessed relative to such surface in a hole or depression in the component.

Microelectronic elements such as semiconductor chips, and semiconductor chips which have one or more wiring layers (e.g., in a redistribution structure) on a face thereof coupled to the contacts of the chip, are commonly combined with dielectric and conductive structure to form microelectronic packages. Each microelectronic package includes electrically conductive structure interconnecting the microelectronic element(s) of the package with terminals provided at a surface of the package, the terminals being configured to electrically connect the package with another component such as a circuit panel, among others.

Microelectronic elements can include one or more memory storage arrays that permit data to be written to a storage array and read from a storage array through the contacts at the face of the microelectronic element. One such type of semiconductor chip having memory storage arrays is a dynamic random access memory ("DRAM") chip. With reference to a microelectronic package 10 shown in FIG. 1, the contacts 35 of a DRAM chip 30 are commonly provided in a row of contacts, or sometimes two or more parallel rows of contacts disposed at or near a midpoint of a distance between opposite parallel edges 32a, 32b of the chip. In the multi-chip package 10 seen in FIG. 1, two microelectronic elements, viz. semiconductor chips 30, 31, can be affixed within the package 10 in a back to back configuration overlying a substrate 11. Each microelectronic element 30, 31 is shown having contacts 35, 35', respectively, at faces 19 of the chips 30, 31, the contact-bearing faces 19 of the chips 30, 31 being oriented in oppositely facing directions which face away from the other chip. In the case of upper chip 31, a redistribution structure 37 may couple the contacts 35' thereof with redistribution contacts 36 provided on the face 19 of chip 31 adjacent to the peripheral edges 32a, 32b thereof. Wire bonds 42 couple the redistribution contacts 36 to substrate contacts 41 at a surface of substrate 11. As further seen in FIG. 1, terminals 40 of the package 10 can be electrically coupled with the contacts 35 of the lower chip through leads 38 such as wire bonds and other electrically conductive structure on the substrate 11, e.g., bond pads 39 and traces (not shown).

In high volume manufacturing, processing to produce package 10 must be performed in a specific sequence. As depicted in FIG. 2, in block 102 this processing includes picking a first die (microelectronic element 30) from a first wafer and placing and attaching the microelectronic element 30 in a face-down orientation facing a surface 44 of substrate 11, such as with an adhesive. Thereafter, in block 104, a second die (microelectronic element 31) is picked from a second wafer and placed and attached in the face-up orientation atop microelectronic element 30 such as with an adhesive. The substrate then is inverted so that the face 19 of microelectronic element 30 faces up. In block 106, a first set of wire bonds 38 can be formed which electrically couple contacts 35 of the lower chip 30 with corresponding contacts 39 on the substrate 11. Subsequently, in block 108, the substrate is inverted again so that face 19 of microelectronic element 31 faces up and thereafter in block 110 another set of wire bonds is formed connecting the RDL contacts 36 of microelectronic 31 with other contacts 41 on substrate 11.

In high volume manufacturing, processing to produce package 10 must be performed in a specific sequence. As depicted in FIG. 2, in block 102 this processing includes picking a first die (microelectronic element 30) from a first wafer and placing and attaching the microelectronic element 30 in a face-down orientation facing a surface 44 of substrate 11, such as with an adhesive. Thereafter, in block 104, a second die (microelectronic element 31) is picked from a second wafer and placed and attached in the face-up orientation atop microelectronic element 30 such as with an adhesive. Thereafter, in block 106, a first set of wire bonds can be formed which electrically couple redistribution contacts 36 of the upper chip 31 with corresponding contacts 41 on the substrate 11. Subsequently, in block 108, the substrate then is inverted so that the face 19 of microelectronic element 30 faces up, and thereafter in block 110 another set of wire bonds 38 is formed connecting the contacts 35 of microelectronic 30 with other contacts 43 on substrate 11.

Referring now to FIG. 3, in a second type of multi-chip microelectronic memory package 210 according to the prior art, two microelectronic elements (e.g., dies or chips 230, 231) are vertically stacked above a surface 244 of package substrate 211 and each has a contact-bearing face 219 which faces upwardly away from the surface 244 of substrate 211. In this case, because the faces 219 of each of the chips 230, 231 faces up, i.e., away from the substrate 211, a spacer element 233 may be needed to provide and maintain a desirable standoff height H between the face 219 of the lower chip 230 and a rear face 221 of the upper chip 231 to accommodate wire bonds 242 which couple contacts of the lower chip 230 with corresponding contacts 241 of the substrate 211.

As further seen in FIG. 4, a common method of manufacturing the package 210 can include in block 202 placing and attaching a first die or first microelectronic element from a first wafer face up above surface 244 of the substrate, and thereafter in block 204 placing and attaching a spacer element 233 overlying the contact-bearing face 219 of the first microelectronic element 230. Then, in block 206 wire bonds 242 are formed which couple the contacts of the first microelectronic element 230 with substrate contacts 241. The wire bonds must be formed before the spacer element 233 is attached. Thereafter, block 208 provides placing and attaching a second die or second microelectronic element 231 taken from a second wafer face up on the substrate, after which block 212 provides forming wire bonds which electrically couple the second microelectronic element 231 with contacts 241 of the substrate.

In high volume manufacturing of multi-chip packages as shown in FIGS. 1 and 3, it is not possible for the microelectronic elements 30, 31, or for the microelectronic elements 230, 231, to be taken from the same wafer and combined together in the same microelectronic package. In high volume manufacturing, each manufacturing step of placing a die or spacer element as indicated in FIGS. 2, 4, ordinarily must be performed at a different station than a station at which wire bonds are formed. Therefore, a sequence which involves performing a step at one station of placing a die and then performing a step at another station of forming wire bonds, and then performing another step of placing a die will not be capable of forming packages in a way that ensures that two dies from the same wafer will be placed within the same package.

Moreover, referring again to FIG. 2, the steps required to form the package 10 shown in FIG. 1 do not result in two dies from the same wafer being placed in the same package 10 in high volume manufacturing because the dies have front faces 19 which are oriented in respective opposite directions. Tooling used to transfer dies from one wafer for assembly with package substrates must either be set up for transfer of the dies in a face-down orientation relative to the substrates, or transfer of the dies in a face-up orientation relative to the substrates, but cannot do both. Therefore, the dies 30, 31 assembled in package 10 must be obtained from two different wafers due to different orientations required for each die.

Moreover, since the upper die 31 has a different pattern of contacts 36 thereon than the contacts 35 of the lower die 30, the dies 30, 31 cannot be obtained from the same wafer in high volume manufacturing, as the contacts 36 are formed at wafer-level before the wafer has been diced into individual dies. Moreover, in a case in which the contacts 36 are redistribution contacts coupled to central contacts 35', such redistribution contacts would also be formed at wafer-level and thus, dies 30, 31 would not be from the same wafer in that case either.

Size is a significant consideration in any physical arrangement of chips. The demand for more compact physical arrangements of chips has become even more intense with the rapid progress of portable electronic devices. Merely by way of example, devices commonly referred to as "smart phones" and "tablet computers" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The components which form the interconnections should not greatly increase the size of the assembly. Similar needs arise in other applications as, for example, in data servers such as those used in internet search engines. For example, structures which provide numerous short, interconnects between complex chips can increase the bandwidth of the search engine and reduce its power consumption.

In view of the foregoing, further improvements can be made to improve the manufacturing of multi-chip microelectronic packages, particularly those which include microelectronic elements having memory storage arrays.

BRIEF SUMMARY OF THE INVENTION

According to an aspect of the invention, a method of manufacturing a microelectronic package can include attaching first major surfaces of a first microelectronic element and a spacer element, respectively, to a first surface of a substrate such that a plurality of contacts at the first major surface of the first microelectronic element can be aligned with a first opening extending through the substrate. The method may then provide attaching a second microelectronic element atop second major surfaces of the first microelectronic element and the spacer element, respectively, the second major surfaces opposite the first major surfaces, such that a plurality of contacts on a surface of the second microelectronic element facing the substrate can be disposed beyond an edge of the first microelectronic element and can be aligned with a second opening in the substrate other than the first opening.

Electrical connections can be formed thereafter between the first microelectronic element and the substrate and between the second microelectronic element and the substrate. The steps of attaching the microelectronic elements and spacer element can be done by transferring the first and second microelectronic elements from first and second positions of a single diced wafer to respective positions overlying the first surface of the substrate. First and second positions of the diced wafer can be selected so as to maximize compound speed bin yield of the microelectronic package produced by performing these processing steps in high volume manufacturing.

In one or more examples, the contacts of the first microelectronic element can be aligned only with the first opening and second die contacts can be aligned only with the second opening.

In one or more examples, the first and second microelectronic elements can have memory storage array function.

In one or more examples, the step of forming electrical connections can include inserting a tip of a bonding tool through the first opening to bond a plurality of first leads only to the contacts of the first microelectronic element, and inserting the tip of a bonding tool through the second opening to bond a plurality of second leads only to the contacts of the second microelectronic element. In one or more examples, the first leads can be first wire bonds and the second leads can be second wire bonds.

In one or more examples, the second microelectronic element can have first and second parallel opposite edges and the contacts of the second microelectronic element can be exposed at a central region of the first major surface thereof. A majority of the contacts of the second microelectronic element can be disposed within one or two rows of the contacts of the second microelectronic element, each row of contacts extending in a direction parallel to the first and second edges of the second microelectronic element.

In one or more examples, the contacts of the first microelectronic element can be exposed at a central region of the first major surface thereof. A majority of the contacts of the first microelectronic element can be disposed within one or two columns of the contacts of the first microelectronic element, each such column extending in a direction parallel to first and second edges of the first microelectronic element.

In one or more examples, the steps by which the first and second microelectronic elements are attached can include transferring the first and second microelectronic elements from closely neighboring positions of the diced wafer.

In one or more examples, the second microelectronic element can be transferred from a position immediately adjacent to the position of the first microelectronic element on the single diced wafer.

In one or more examples, the method can include attaching the first major surfaces of the first microelectronic element and the spacer element to the surface of the substrate with an adhesive bonding the first major surfaces.

In one or more examples, the method may include advancing a continuous tape to a station of an assembly line, the continuous tape comprising a plurality of the substrates adjoining one another at at least first edges thereof which can be oriented in a first direction. Thereafter, an adhesive can be applied to the surface of at least one of the substrates, and the attaching of at least the first microelectronic element can be performed using the applied adhesive.

In one or more examples, the attaching of the second microelectronic element can include attaching the major surface of the second microelectronic element atop the second major surfaces of the first microelectronic element and the spacer element with an adhesive overlying the second major surface of the first microelectronic element at a time of attaching the first major surface of the second microelectronic element thereto.

In one or more examples, at least portions of the first and second openings can be spaced apart from one another by dielectric material of the substrate.

In one or more examples, the first opening does not adjoin the second opening.

In one or more examples, the first and second openings can be portions of a continuous opening extending through the substrate.

In one or more examples, the attaching of the second microelectronic element can include applying a second adhesive atop the second major surface of at least the first microelectronic element and then placing the second microelectronic element atop the second major surfaces of the first microelectronic element and the spacer element.

In one or more examples, the forming of the electrical connections can include depositing a conductive material to electrically connect the contacts of at least one of the first or second microelectronic elements with corresponding contacts on the substrate.

In one or more examples, the method may further include, prior to performing the attaching of the first microelectronic element, positioning a first element comprising a plurality of substrates each attached to one another at at least first and second peripheral edges thereof such that a first substrate thereof can be positioned at a first station of an assembly line. The method may further include transferring at least the first microelectronic element to the position atop the first substrate when the first substrate is positioned at the first station. The method can also include attaching the spacer element thereto, either before or after the first microelectronic element is transferred to its position. Thereafter, the method may include positioning the first element such that the first substrate is positioned at a second station of the assembly line, and then applying an adhesive atop the second major surfaces of the first microelectronic element and the spacer element, respectively. The method may include then repositioning the first element such that the first substrate is repositioned at the first station, wherein the attaching of the second microelectronic element can include then transferring at least the second microelectronic element to the position atop the second major surfaces of the first microelectronic element and the spacer element.

In one or more examples, the first element can include a continuous indexable dielectric tape comprising the plurality of substrates. The step of positioning the first element prior to performing the attaching of the first microelectronic element can be performed by indexing the dielectric tape in a first direction. The step of positioning the first element after applying the adhesive can be performed by indexing the dielectric tape in at least one of the first direction or a second direction opposite to the first direction.

In one or more examples, the positioning of the first element such that the first substrate is positioned at the second station can be performed by indexing the dielectric tape in the first direction. In one or more examples, the positioning of the first element after applying the adhesive can be performed by indexing the dielectric tape in the second direction.

In one or more examples, the positioning of the first element such that the first substrate is positioned at the second station can be performed by indexing the dielectric tape in the second direction. In one or more examples, the repositioning of the element after applying the adhesive such that the first substrate is repositioned again at the first station can be performed by indexing the dielectric tape in the first direction.

In one or more examples, the method can be performed so as to further include, prior to performing the attaching of the first microelectronic element, moving at least one of a continuous tape comprising a plurality of substrates attached to one another at at least first edges thereof, or a first station of an assembly line relative to one another such that a first substrate thereof can be positioned at the first station. The attaching of the first microelectronic element and the spacer element can include transferring the first microelectronic element and the spacer element to respective positions atop the first substrate when the first substrate is positioned at the first station. The method can be performed, prior to performing the attaching of the second microelectronic element, so as to further include advancing the continuous tape such that the first substrate with the first microelectronic element and the spacer element attached thereto arrives at a second station of the assembly line at a location different from the first station. The method can further include then applying an adhesive to the second major surfaces of the first microelectronic element and the spacer element. The method can further include then moving at least one of the continuous tape or the first station relative to one another such that the first substrate thereof arrives again at the first station. In such method, the attaching of the second microelectronic element can include transferring the second microelectronic element to its position atop the first substrate when the first substrate is positioned at the first station.

In one or more examples, the substrate can include a B-stage material exposed at the major surface, wherein the attaching of the first microelectronic element and the spacer element can be performed by placing the first microelectronic element and the spacer element on the major surface of the substrate, and the method may further include curing the B-stage material after performing at least one of after the attaching of these elements, or after the attaching of the second microelectronic element.

In one or more examples, the method can be performed such that, prior to transferring the first and second microelectronic elements from the first and second positions to their respective positions overlying the surface of the substrate, an adhesive is disposed between the major surfaces of the first and second microelectronic elements, respectively and a handling element, wherein the first and second microelectronic elements can be adhesively attached to the substrate with the adhesive.

A method according to another aspect of the invention can include attaching a first major surface of a first microelectronic element to a first surface of a substrate such that a plurality of contacts at the first major surface of the first microelectronic element can be aligned with a first opening extending through the substrate. The method can include then attaching a second microelectronic element atop a second major surface of the first microelectronic element, the second major surface opposite the first major surface, such that a plurality of contacts at a surface of the second microelectronic element facing the substrate can be disposed beyond an edge of the first microelectronic element and can be aligned with a second opening in the substrate other than the first opening. The method can include assembling a third microelectronic element and a fourth microelectronic element with the first and second microelectronic elements to respective positions overlying the surface of the substrate such that the first and third microelectronic elements can be each adjacent to the major surface of the substrate and can be spaced apart from one another, and each of the second and fourth microelectronic elements partially overlies the first and third microelectronic elements and can have contacts exposed beyond edges of the first and third microelectronic elements. Electrical connections can then be formed between the first microelectronic element and the substrate, between the second microelectronic element and the substrate, between the third microelectronic element and the substrate, and between the fourth microelectronic element and the substrate. These steps can include transferring the first, second, third, and fourth microelectronic elements from first, second, third, and fourth positions of a single diced wafer to respective positions overlying the first surface of the substrate, wherein the positions of the diced wafer can be selected so as to maximize compound speed bin yield of the microelectronic package when performing these steps in high volume manufacturing.

An aspect of the invention provides a method of manufacturing a microelectronic package. The method can include) adhesively attaching major surfaces of first, second, third and fourth microelectronic elements to a major surface of a first substrate. Each of the microelectronic elements can be spaced apart from all others of the first, second, third and fourth microelectronic elements in at least one direction parallel to the major surface. The attaching can include transferring the first, second, third and fourth microelectronic elements from original positions of a single wafer. The method can be performed such that, after the attaching, electrical connections then are formed between each of the first, second, third and fourth microelectronic elements and the first substrate. Such processing can be include transferring the microelectronic elements from positions of a single diced wafer to respective attachment positions of the major surface of the substrate, wherein the positions of the diced wafer can be selected so as to maximize compound speed bin yield of the microelectronic package when performing these steps in high volume manufacturing.

In one or more examples, the first substrate can comprise a continuous tape which can include a plurality of the substrates attached to one another at peripheral edges thereof. In such case, the method may further include, after the forming of the electrical connections, severing the first substrate with the microelectronic elements attached thereto from the continuous tape to provide an individual microelectronic package.

In one or more examples, each of the first, second, third and fourth microelectronic elements can have a column of contacts exposed at its respective major surface which can be arranged along a respective axes selected from first, second, third, and fourth axes, wherein the first and third axes can be parallel to one another, and the second and fourth axes can be parallel to one another and transverse to the first and third axes.

BRIEF DESCRIPTION OF THE SEVERAL VIEWS OF THE DRAWINGS

FIG. 6B is a plan view illustrating a microelectronic element which can be provided in the microelectronic package of FIG. 6A;

DETAILED DESCRIPTION OF THE INVENTION

Figure 1:
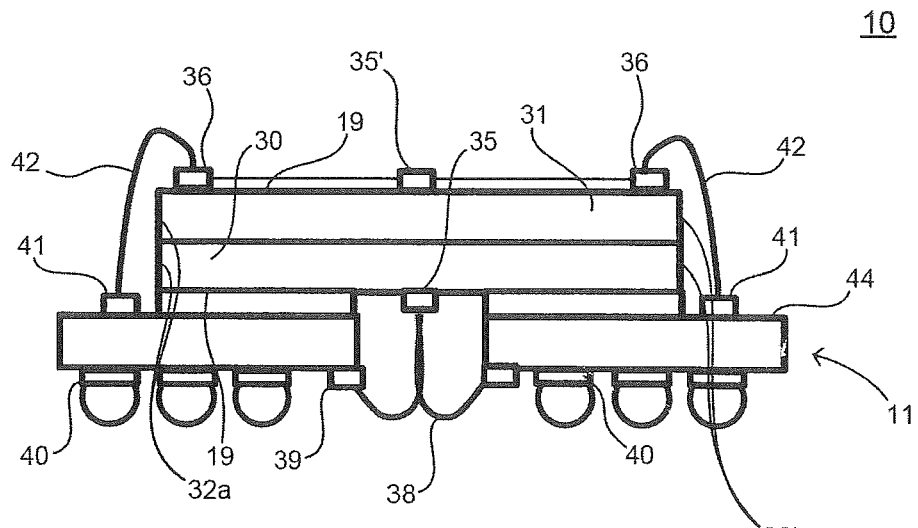
FIG. 1 illustrates a first multi-chip microelectronic package in accordance with the prior art.
Figure 2:
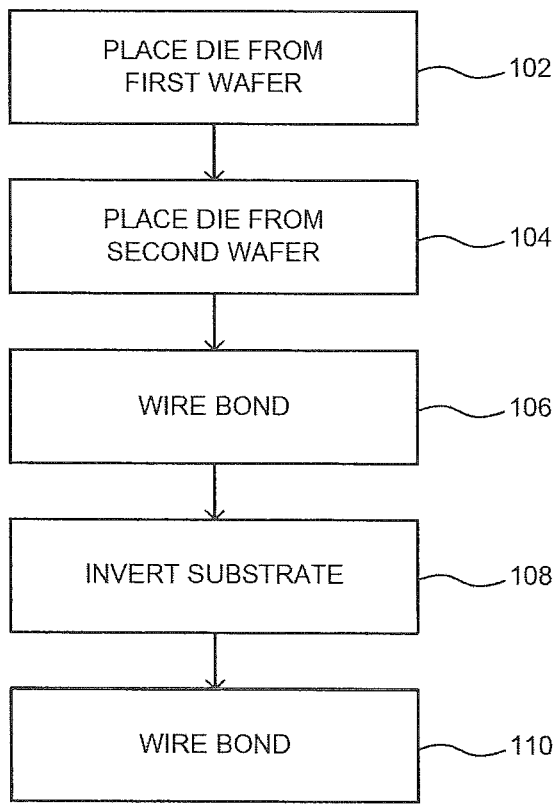
FIG. 2 depicts a method of manufacturing the microelectronic package shown in FIG. 1 in accordance with the prior art.
Figure 3:
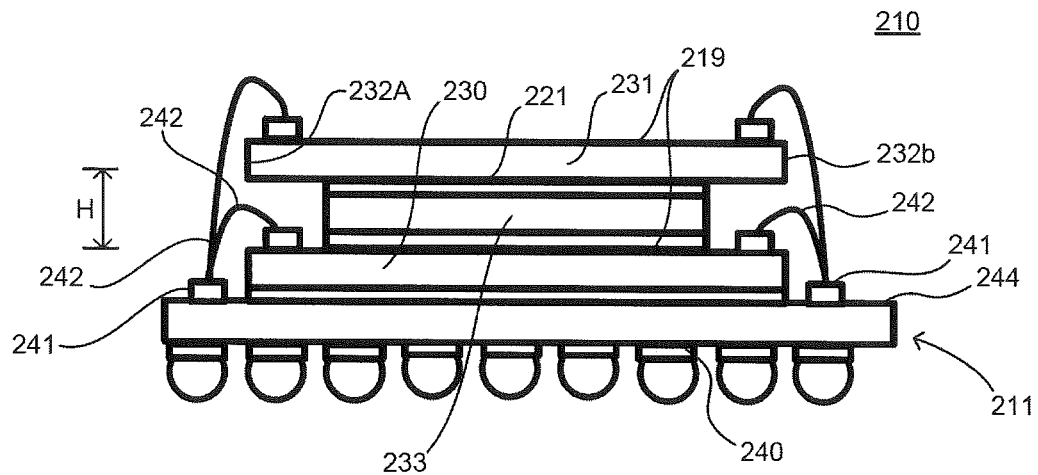
FIG. 3 illustrates a second multi-chip microelectronic package in accordance with the prior art.
Figure 4:
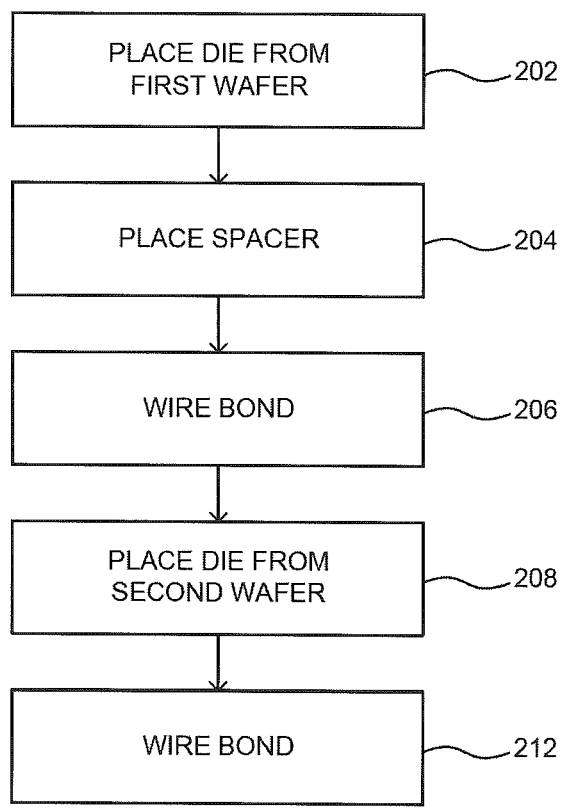
FIG. 4 depicts a method of manufacturing the microelectronic package shown in FIG. 3 in accordance with the prior art.

In the manufacture of semiconductor chips, considerable variations occur in the performance of each chip, i.e., operating speed or data transfer rate that each chip can support. To a large extent, the performance of an individual chip is specific to the wafer from which it is obtained, due to variations in conditions under which the wafer is processed during its manufacture. These variations can occur in the chips which are obtained from semiconductor wafers produced at different wafer fabrication facilities, as well as the chips obtained from particular batches of semiconductor wafers manufactured at different times in the same fabrication facility. Substantial performance variations can occur even within the same batch of semiconductor wafers produced in the same fabrication facility. In the case of DRAM chips for example, the maximum operating speed or data transfer rate of a JEDEC compatible double date rate version 3 or version 4 (hereinafter "DDR3 or DDR4" DRAM chip of the same type and manufacturer can vary by as much as 50 percent when the manufacturer first begins production. However, even after the manufacturer enters full production, the maximum operating speed of DRAM chips of the same type produced by the same manufacturer in the same facility may still vary by around 20 percent to 30 percent.

One problem that the inventors have recognized in connection with the above-discussed background art is unsatisfactory compound speed bin yield of the multi-chip packages produced thereby. The inventors recognize that for some types of multi-chip memory packages, particularly multi-chip DRAM packages, the compound speed bin yield of the packages produced according to the above-discussed background methods can be hampered in cases where maximum operating speed is limited by the maximum speed of the worst performing microelectronic element in the multi-chip package. The background methods which combine chips from different wafers suffer from poor compound speed bin yield because of substantial variations in the performance of chips obtained from multiple wafers.

According to aspects of the disclosure, a high volume manufacturing method is provided in which a plurality of microelectronic elements obtained from the same wafer are assembled together in the same multi-chip microelectronic package. Thus, for example, individual microelectronic elements such as DRAM chips which can be expected to achieve the same operating speeds due to having come from the same wafer can be assembled together by a high volume manufacturing method in the same package so as to maximize the compound speed bin yield of the package. In particular examples of the methods herein, microelectronic elements 102 can be obtained from the same region of the same wafer which may further enhance the compound speed bin yield.

High volume manufacturing methods provided according to particular embodiments herein involve the transfer of a plurality of microelectronic elements 102 from a common single diced semiconductor wafer 100 (FIG. 5) for assembly in the same multi-chip microelectronic package. The single diced wafer 100 can be provided by dicing a wafer into a plurality of individual microelectronic elements, which may include placing the semiconductor wafer on a "dicing tape" of dielectric material having an adhesive surface, after which the wafer 100 is then diced to produce a plurality of individual microelectronic elements 102 which remain attached to the dicing tape. In other examples, the individual microelectronic elements can be first diced on a structure or fixture and then transferred to a tray which maintains the chips in position for p and p by the equipment. In either case the microelectronic elements remain attached with the dicing tape until transferred using "pick and place" handling equipment to appropriate locations during assembly of the multi-chip microelectronic package.

Thus, in one example, microelectronic elements 102 which are combined together in one package may be obtained from the same wafer 100. In particular examples, the microelectronic elements 102 can be obtained from the same confined region of a wafer, or even from adjacent positions within a region of a single diced wafer 100. In this way, chances can be increased that chips obtained from the same region or from adjacent positions of the wafer will support the same maximum data transfer rates. In one example, such regions and chip positions on the wafer can be determined by testing chips of similar wafers being produced under similar conditions. In yet another example, the microelectronic elements may be selected for use in a package in accordance with a predetermined pattern for "picking" each microelectronic element from the single diced wafer. For example, microelectronic elements can be "picked" from the diced wafer for inclusion in the package in a way which selects every second microelectronic element from the diced wafer for assembly within the package. The methods described above may be applied to the high volume manufacturing of various types of microelectronic packages, as will be further shown and described below.

Figure 6A:
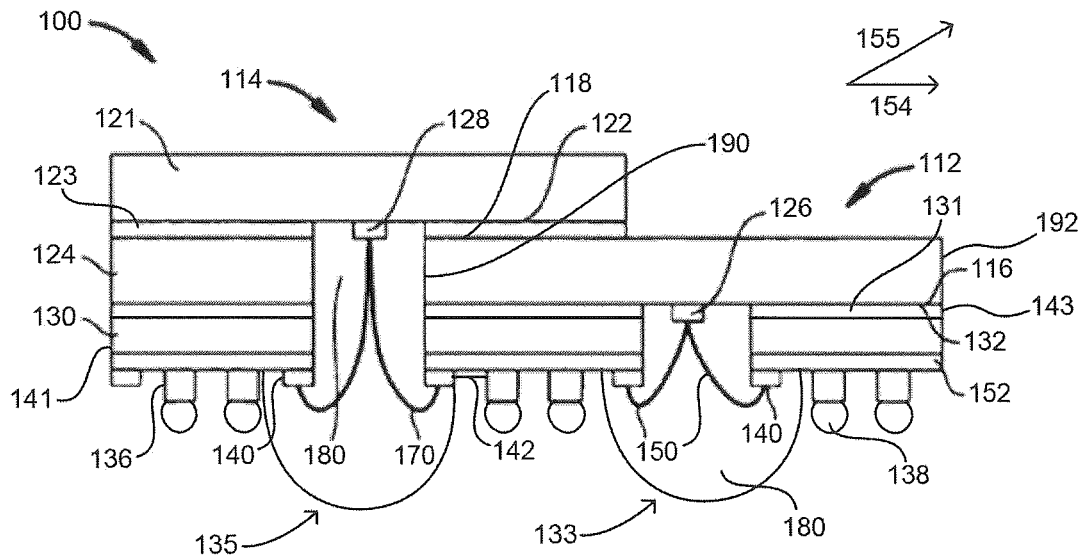
FIG. 6A is a diagrammatic sectional elevational view of the stacked assembly according to a first embodiment of the present invention.

High volume manufacturing methods in accordance with various embodiments will now be described for packages having various constructions. As shown in FIG. 6A, a stacked microelectronic assembly 100, which can be manufactured according to an embodiment herein, can include a package substrate 130 such as a dielectric element having a first surface 132, a second surface 152 and a plurality of electrically conductive terminals 136 at the second surface 152. In one example, the dielectric element 130 may comprise a layer of flexible material, such as a layer of polyimide, BT resin or other dielectric material of the type commonly utilized for making tape automated bonding ("TAB") tapes. In one example, the dielectric element can comprise a relatively rigid, board-like material such as a thick layer of fiber-reinforced epoxy as, for example, an FR-4 or FR-5 board and a layer of a die attach adhesive 131 defining a first surface 132 of the substrate. Dielectric element 130 also includes additional conductive features including bond pads 140 exposed at second surface 152 and conductive traces 142 connecting bond pads 140 to terminals 136.

Dielectric element 130 includes a first aperture 133 and a second aperture 135, each of the apertures extending through a thickness of the dielectric element between the first and second surfaces 132, 152. Microelectronic element 112 is disposed over first surface 132 of dielectric element 130 in a downwardly-facing orientation, with the front surface 116 of the microelectronic element 112 facing the upwardly-facing first surface 132 and attached thereto by adhesive 131. With regard to the present disclosure, terms such as "downwardly" or "upwardly" are used to describe directions that are opposed to each other without regard to any gravitational frame of reference. Similarly, terms such as "over" and "under", or "above" and "below" are used to describe the relative position to elements or assembly within the frame of reference of the assembly itself.

The microelectronic element 112 has a set of contacts 126 on a surface 116 thereof for transferring signals to and from the microelectronic element. Referring to FIG. 6B, typically, the contacts are disposed in a central region 194 of the surface 116 and may be disposed in one row 127 or two rows or a greater number of rows therein, such row extending in a direction 155 which is out of the plane of the sectional view depicted in FIG. 6A, such direction 155 being parallel to a direction in which first and second opposite peripheral edges 190, 192 of microelectronic element 112 extend. In a particular example, all of the contacts of a microelectronic element can be disposed in the central region of the surface. In another example, only a majority of the contacts of the microelectronic element may be positioned in the central region of the surface 116 of that microelectronic element 112. As used herein with respect to a contact-bearing face of a microelectronic element having first and second opposite peripheral edges 190, 192, a "central region" such as region 194 means a region of the face 116 which is disposed between a first peripheral region 196 adjacent to the first edge 190, and a second peripheral region 198 adjacent to the second edge 192, each of the first and second peripheral regions and the central region having equal width in a direction 154 along surface 116 which is perpendicular to edges 190, 192. In this way, the central region 194 extends a middle third of the distance between the edges 190, 192 in a direction between the first and second edges. Thus, a central region 144 of the surface 116 of microelectronic element 112 can be seen occupying a middle third 146 of a shortest distance extending in a direction 154 along surface 116 between the first and second peripheral edges 190, 192 of the microelectronic element 112, wherein direction 154 is orthogonal to direction 155.

A second microelectronic element 114 partially overlies a rear surface 118 of first microelectronic element 112, typically with an adhesive layer 123 bonding a first major surface or front surface 122 of the second microelectronic element to the rear surface 118 of the first microelectronic element. A portion of the surface 122 of the second microelectronic element may overlie and be bonded to a spacer element 124 disposed between the second microelectronic element and the surface 132 of the dielectric element. In one example, the spacer element can be formed of a material having a coefficient of thermal expansion ("CTE") the same as or similar to the CTE of the microelectronic elements. Thus, when the microelectronic elements are semiconductor chips obtained from a silicon wafer, the spacer element may likewise be of silicon, or a material having the same or similar CTE.

The second microelectronic element 114 can have a set of contacts 128 on a surface 122 thereof for transferring signals to and from the second microelectronic element 114. Similar to the first microelectronic element, the contacts of the second microelectronic element can be disposed in a central region of the surface 122 and may be disposed in one or two parallel rows or a greater number of rows therein. Referring again to FIG. 6A, the second aperture 135 may underlie at least a portion of the central region of the second microelectronic element 114 such that the substrate and spacer element do not obscure the contacts 128.

As further shown in FIG. 6A, leads 150 can be in the form of wire bonds, and can be used to connect contacts 126 of first microelectronic element 112 to some of the bond pads 140 at the second surface of the dielectric element. Other leads which can be in the form of wire bonds 170 and can be used to connect contacts 128 of second microelectronic element 114 to other bond pads 140. In one example, at least some of the wire bonds 160, 170 may be coupled through bond pads 140 and traces 142 to at least some of the terminals 136.

Package 100 may further include an encapsulant 180 that covers leads 150, 170 and protects the microelectronic elements 112, 114. The encapsulant may also be provided extending from the front surfaces 116, 122 of the microelectronic elements, thoroughly surrounding leads 150, 170, and may fill open spaces between microelectronic elements 112 and 114. Among possible encapsulants are epoxies, flexibilized epoxies, and silicone elastomers.

Package 100 may further include a plurality of joining elements, such as solder balls 138, for example, as shown in FIG. 6A. Solder balls 138 can be attached to terminals 136 and hence are electrically coupled with at least some of the bond pads 140, leads 150 and 170 and contacts 126 and 128. Other types of joining elements such as solid-core solder balls or masses or balls of a diffusion-bonding or other bonding material, masses of conductive polymer composition, electrically conductive posts of a metal other than a low melting temperature metal, or the like can be employed, as well as other types of terminals which can be of any type. In use, the terminals 136 of the package 100 can be mounted to corresponding contacts of a circuit panel (not shown)

Figure 5:
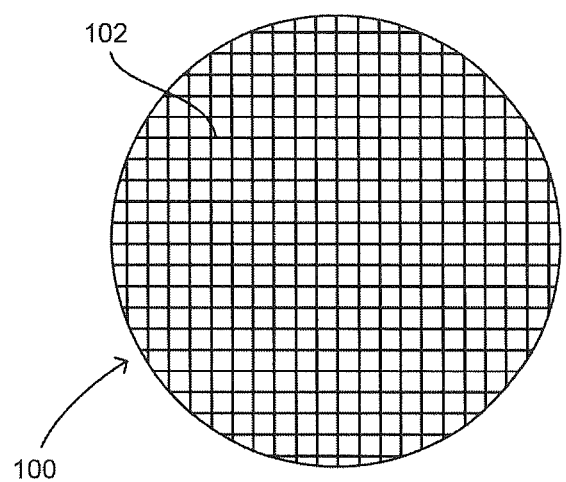
FIG. 5 is a top of a diced wafer according to aspects of the disclosure.
Figure 7:
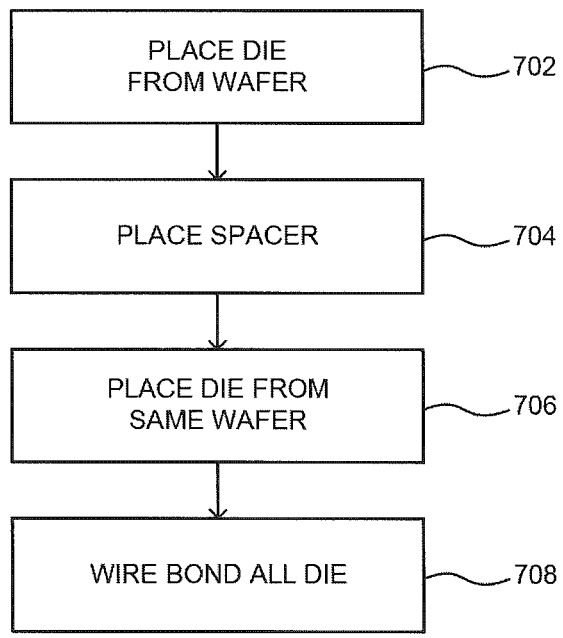
FIG. 7 depicts a method of manufacturing the microelectronic package illustrated in accordance with FIGS. 6A-6C in accordance with an embodiment of the invention.

In one embodiment, the microelectronic package seen in FIGS. 6A-B can be manufactured by a method as illustrated in FIG. 7. Thus, referring to block 702 of FIG. 7, in a high volume manufacturing a microelectronic element 102, e.g., a semiconductor die, can be picked from a diced wafer 100 as seen in FIG. 5 and placed face down as microelectronic element 112 onto an adhesive layer 131 overlying the first surface 132 of the above-described substrate 130 such that adhesive layer 131 bonds the surface 116 of such microelectronic element 112 to the first surface 132. Next, as depicted in block 704 of FIG. 7, spacer element 124 can likewise be placed and attached to the first surface 132 of the substrate either before or after placing microelectronic element 112 thereon. Alternatively, the spacer element 124 can be attached to the substrate 130 prior to attaching the first microelectronic element 112 at a location of the substrate spaced apart from and parallel to edge 190 and in at least general alignment with an edge of the substrate 130 which defines opening 135.

Thereafter, referring to block 706 of FIG. 7, a second microelectronic element 102, e.g., a second die, can be picked from the same wafer 100 (FIG. 5) from which microelectronic element 112 was picked and the second microelectronic element 114 can then be placed face down onto adhesive layer 123 partially overlying a rear face 118 of the first microelectronic element 112 and partially overlying spacer element 124 so as to bond the face 122 of the second microelectronic element to the spacer element 124 and to rear face 118 of the first microelectronic element 112. Thereafter, referring to block 708 of FIG. 7, wire bonds 150 can be formed which may coupled the bond pads 140 at surface 152 of the substrate 130 with the corresponding contacts 126 at the surface 116 of the first microelectronic element 112, and wire bonds 170 can be formed which couple the contacts 140 at surface 152 of the dielectric element with the corresponding contacts 128 at the surface 122 of the second microelectronic element 114.

It should be noted that the microelectronic package 100 seen in FIGS. 6A-6B can be manufactured in an assembly line method using dielectric elements 130 which are provided in form of a continuous strip containing a plurality of dielectric elements 130 per each strip. For example, each strip may contain a plurality of substrates 130 which are joined with one another at edges 141 and 143 initially, and which are severed from one another after microelectronic elements 112, 114 are united with corresponding substrates 130 and electrically connected together through leads. In such method, each strip may have width only for a single substrate 130, i.e. a region of the continuous strip, to be advanced in a direction of the assembly line at a time, such strip having a length ranging from several times the dimension of the dielectric element between peripheral edges 141, 143.

In a particular example of such assembly line method, prior to performing the processing of block 702 (FIG. 7), the continuous strip can be advanced to a station of the assembly line, at which time an adhesive can be applied to surface 132 of at least one of the substrates, wherein the attaching of block 702 is performed using the applied adhesive.

In another example of the method herein, the second microelectronic element 114 can be placed atop the rear surface 118 of the first microelectronic element 112 and atop the spacer element using an adhesive 123 which is already disposed thereon when the first microelectronic element is picked from the diced wafer and attached to the surface 132 of the substrate 130.

Figure 6C:
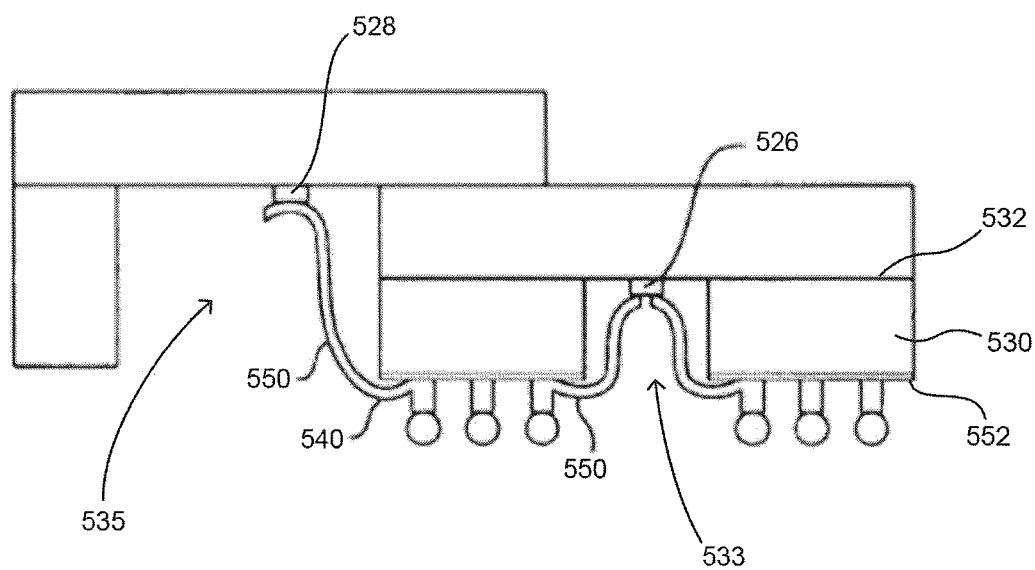
FIG. 6C illustrates a variation of the microelectronic package of FIG. 6A.

FIG. 6C illustrates a variation of the embodiment seen in FIGS. 6A and 6B wherein the leads 550 which electrically couple the contacts 526, 528 of the microelectronic elements have portions extending parallel to the first and second surfaces 532, 552 of the dielectric element 530, and have other portions which extend therefrom towards the contacts 526 and are bonded thereto. In this case, the leads 550 can be bonded to the contacts of the respective microelectronic element by inserting a tip of a bonding tool through the respective aperture 533, 535 of the dielectric element 530. For example, such bonding tool tip can move a portion of one such lead, e.g., an end portion of the lead, such that the end portion of the lead then touches a respective contact of that microelectronic element. Then the applied pressure, as well as applied energy in an appropriate example, bonds the end portion of the lead to the respective contact.

Referring now to FIGS. 9-12, in a variation of the embodiment shown in FIGS. 6A-6C, a microelectronic package 300 can include four microelectronic elements 336, 353, 368 and 388 in a face-down orientation relative to a package substrate 302 having a four through openings 316, 326, 332, 382. Each opening is disposed in alignment with contacts of a respective microelectronic element of the package so as to permit insertion of a tip of a bonding tool to form a bonded lead thereto, e.g., a wire bond 390A or an integral lead of the substrate similar to that of FIG. 6C.

Figure 9:
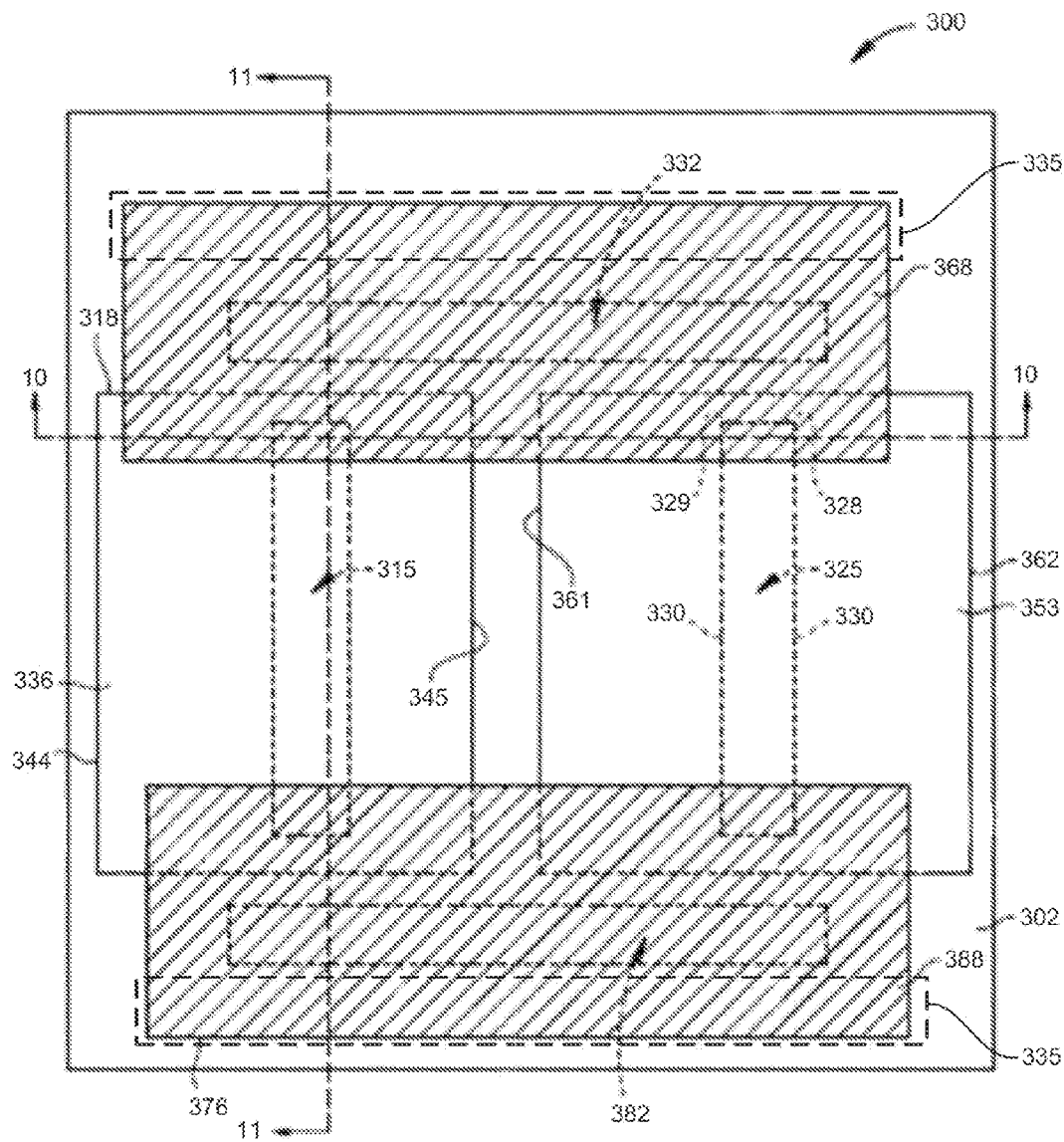
FIG. 9 is a top plan view of a microelectronic package in accordance with an embodiment of the invention.

As best shown in FIG. 9, the first and second openings 316, 326 are positioned in directions that are perpendicular to the third and fourth openings 332, 382. First and second microelectronic elements 336, 353 can have their contact-bearing faces 307, 317 attached to a first surface 304 of the substrate 302 with an adhesive 301. Contacts 342 on the first microelectronic element 336 may be positioned over the first opening 316 and bond pads 359 on the second microelectronic element 353 may be positioned over the second opening 326. As shown, the first and second edges 344, 345 of the first microelectronic element 336 and the first and second edges 361, 362 of the second microelectronic element 353 can be parallel to one another, and extend in the same direction.

Figure 12:
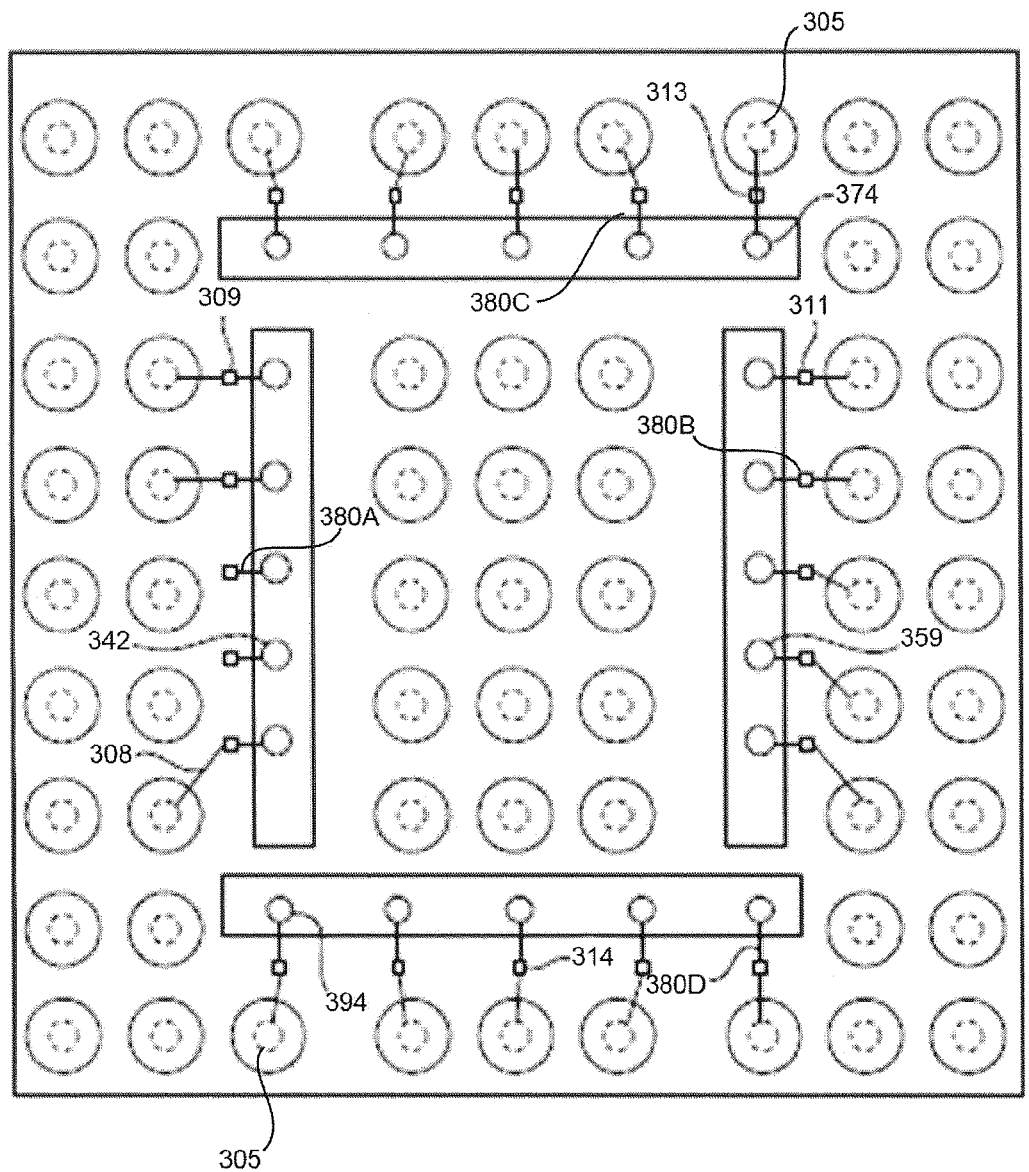
FIG. 12 is a bottom plan view of a microelectronic package as further seen in FIGS. 9, 10 and 11.

The third and fourth microelectronic elements 368, 388 may be positioned over the first surface 304 of the substrate 302, as well as over rear surfaces 338, 355 of the first and second microelectronic elements 336, 353. The front surface 372 of the third microelectronic element 368 faces towards the rear surfaces 338, 355 of the first and second microelectronic elements 336, 353. Similarly, the front surface 392 of the fourth microelectronic element 388 faces towards the rear surfaces 338, 355 of the respective first and second microelectronic elements 336, 353. Spacer elements 335 can be positioned between the first surface 304 of the substrate and portions of the third and fourth microelectronic elements 368, 388 that do not overlie the first and second microelectronic elements 336, 353. As shown in FIG. 12, leads 380A, 380B, 380C, 380D, such as bond wires, can be coupled to contacts on each respective microelectronic element and be coupled with corresponding terminals 305 of the package 300 through conductive structure such as bond pads 313, 309, 314 and traces 308 extending along the second surface 306 of the substrate 302.

Figure 8:
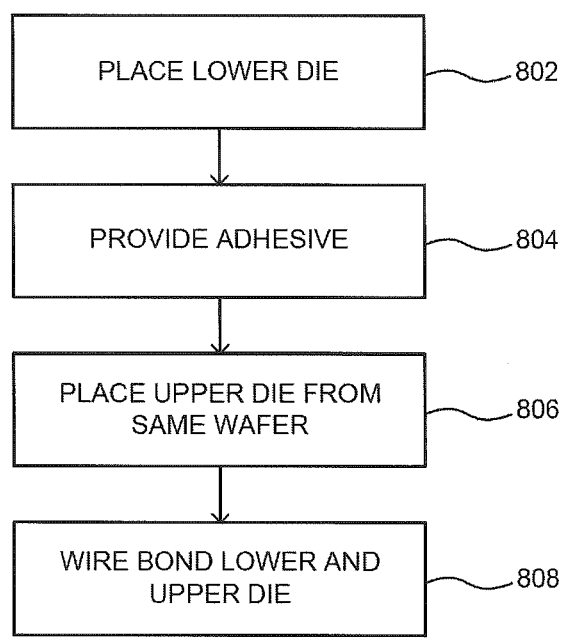
FIG. 8 depicts a method of manufacturing the microelectronic package illustrated in accordance with FIGS. 9-12 in accordance with an embodiment of the invention.
Figure 10:
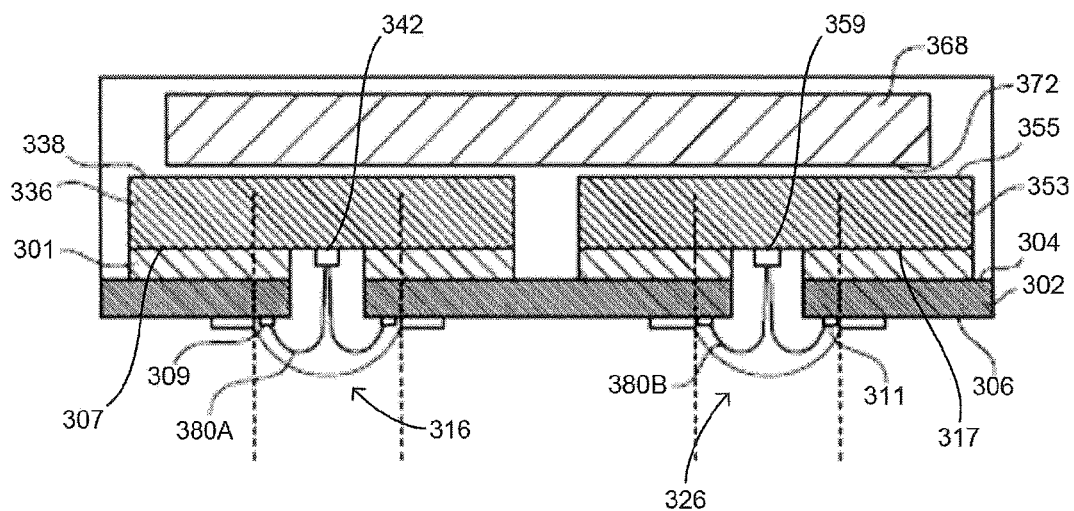
FIG. 10 is a sectional view corresponding to FIG. 9 through lines 10-10 thereof.
Figure 11:
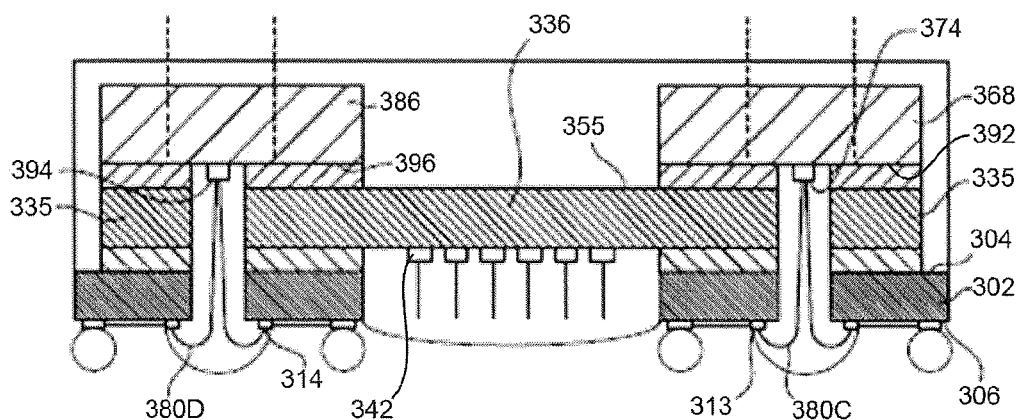
FIG. 11 is a sectional view corresponding to FIG. 11 through lines 11-11 thereof.

The package 300 can be manufactured by a method similar to that described relative to FIG. 7 above, in which spacer elements may be pre-attached to the substrate prior to the assembly processing referred to in FIG. 8. Thus, prior to block 802 of FIG. 8, spacers 335 may already be attached to the substrate (or attached to a plurality of substrates attached together in a continuous strip as described above). Then, in block 802, both the first and second microelectronic elements 336, 353 can be transferred from a single diced wafer 100 (FIG. 5) and attached to respective spaced apart positions overlying the first surface 304 of the substrate such that the contacts thereon are aligned with respective openings 316, 326 as seen in FIGS. 9 and 10. Adhesive material may then be provided on rear surfaces 338, 355 of the first and second microelectronic elements, as depicted in block 804. Next, referring to block 806, third and fourth microelectronic elements 368, 388 can be transferred to their respective positions in the package from the same diced wafer 100 as the wafer from which microelectronic elements 336, 353 were transferred thereto. Specifically, a "pick-and-place" tool can be used to transfer the third and fourth microelectronic elements to their positions in the package from the same wafer that the first and second microelectronic elements are earlier transferred to the package. Thereafter, the substrate 302 (or continuous strip of substrates), with all four microelectronic elements assembled thereon can be indexed to a station of the assembly line at which a bonding tool can be used to form the wire bonds (or bonded leads) which couple each of the four microelectronic elements with corresponding conductive structure of the substrate as described above.

In a variation of the embodiment, an adhesive material can be disposed on front surfaces 307, 317, 392, 396 of each of the first, second, third and fourth microelectronic elements, 336, 353, 368, 388, respectively, and which remains attached to the front faces when the microelectronic elements are transferred by the pick and place tool to the respective positions relative to the substrate 302 during assembly of the package. In this way, the need to provide an adhesive on the rear faces of the first and second microelectronic elements can be avoided prior to attaching the third and fourth microelectronic elements thereto.

Figure 14:
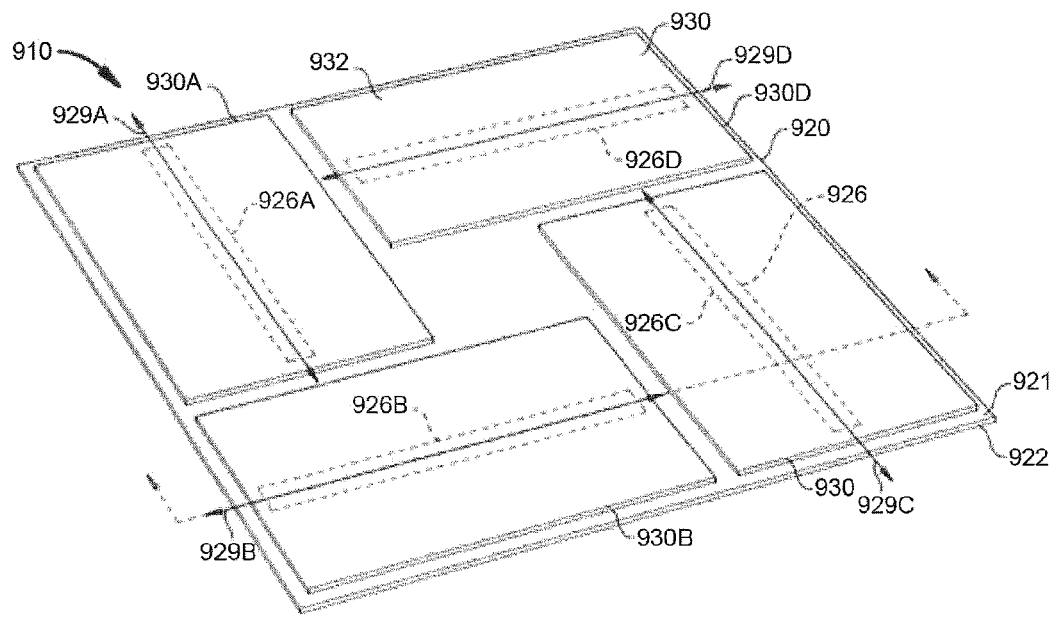
FIG. 14 is a perspective view illustrating a microelectronic package in accordance with an embodiment of the invention.
Figure 15:
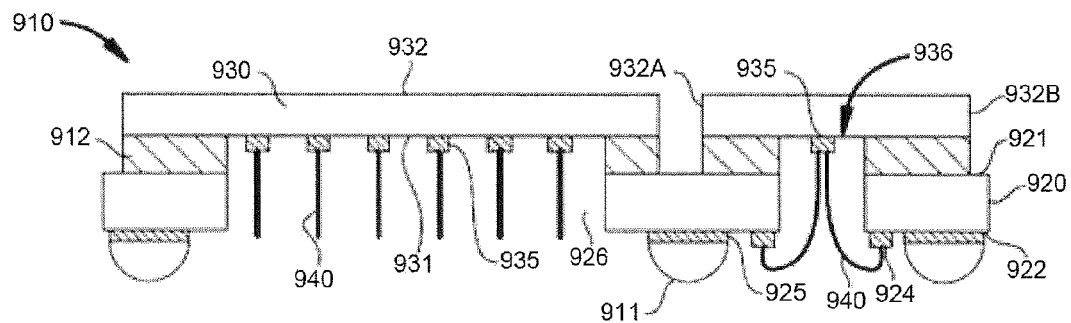
FIG. 15 is a sectional view corresponding to FIG. 14 the through the section line indicated therein traversing microelectronic elements 930b and 930c.
Figure 16:
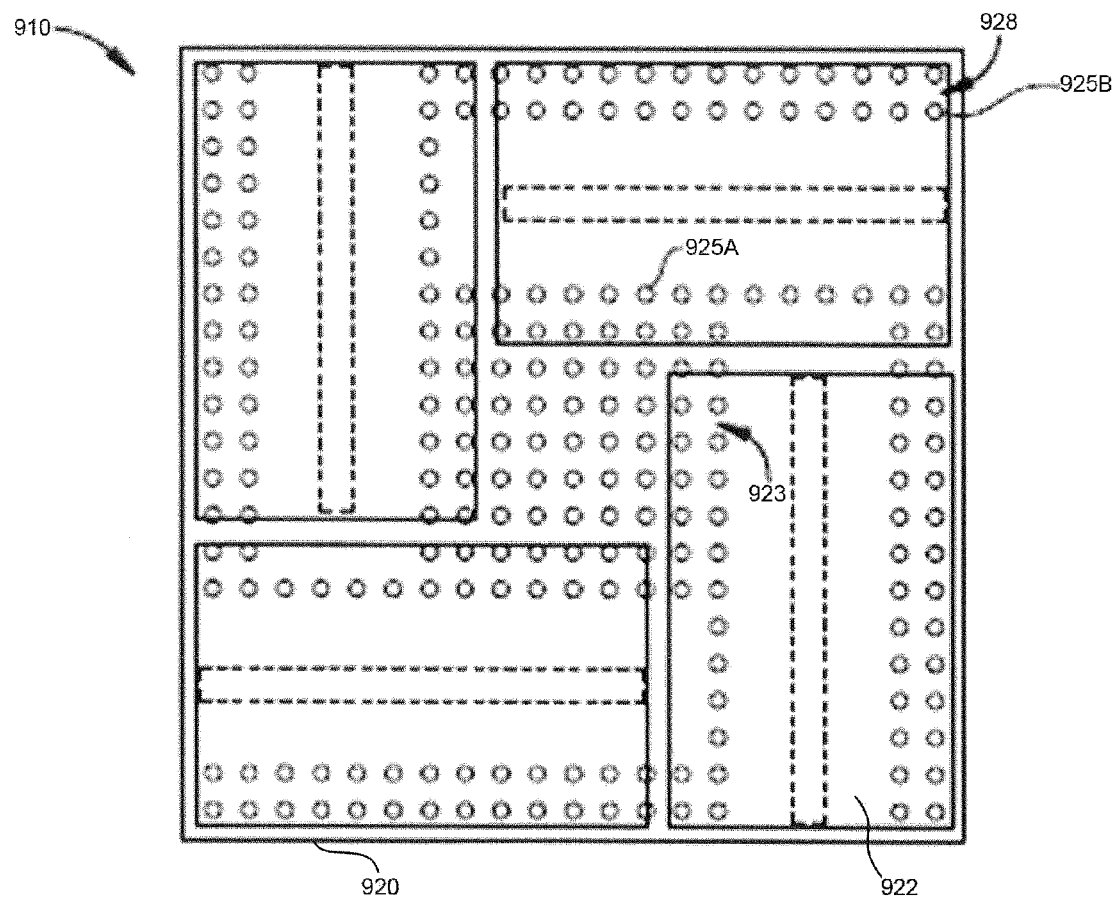
FIG. 16 is a bottom plan view of a microelectronic package as further seen in FIGS. 14 and 15.

FIGS. 14-16 illustrate a multi-chip package 910 having a particular arrangement of microelectronic elements 930a, 930b, 930c, and 930d on a substrate 920 similar to the shape of a pinwheel. In this case, at least some of the plurality of contacts 935 of each microelectronic element 930 can be arranged in a respective column of contacts defining respective first, second, third, and fourth axis 929a, 929b, 929c, and 929d (collectively axes 929). In the example shown in FIG. 14, the first and third axes 929a and 929c can be parallel to one another, the second and fourth axes 929b and 929d can be parallel to one another, and the first and third axes can be transverse to the second and fourth axes. In a particular embodiment, the first and third axes 929a and 929c can be orthogonal to the second and fourth axes 929b and 29d. In one example, each of the first, second, third and fourth axes 929a, 929b, 929c, and 929d, can be defined by a length of a corresponding one of the apertures 926a, 926b, 926c, and 926d, so that the apertures 926 can be arranged in a pinwheel configuration as described above.

In the particular example shown in FIG. 14, the axis 929 of each microelectronic element 930 can bisect the respective microelectronic element and can intersect the area of exactly one other microelectronic element in the microelectronic package 910. For example, the first axis 929a can bisect the first microelectronic element 930a and can intersect the area of exactly one other microelectronic element 930. Similarly, the second axis 929b can bisect the second microelectronic element 930b and can intersect the area of exactly one other microelectronic element 930. The same is also true of the third axis 929c which can bisect the third microelectronic element 930c and can intersect the area of exactly one other microelectronic element 930. Indeed, this is also true of the fourth axis 929*d* that can bisect the fourth microelectronic element 930*d* and can intersect the area of exactly one other microelectronic element 930.

Electrical connections between the contacts 935 and the terminals 925 can include optional leads, e.g., wire bonds 940, or other possible structure in which at least portions of the leads are aligned with at least one of the apertures 926. For example, as seen in FIG. 15, at least some of the electrical connections can include a wire bond 940 that extends beyond an edge of an aperture 926 in the substrate, and is joined to the contact 935 and a conductive element 924 of the substrate. In one embodiment, at least some of the electrical connections can include lead bonds. Such connections can include leads that extend along either or both of the first and second surfaces 921, 922 of the substrate 920 between the conductive elements 924 and the terminals 925. In a particular example, such leads can be electrically connected between the contacts 935 of each microelectronic element 930 and the terminals 925, each lead having a portion aligned with at least one of the apertures 926.

Some of the terminals be provided in a central region 923 at the surface 922 of the substrate, as seen in FIG. 16, and some terminals, e.g., terminals 925*a* and 925*b*, such as used for carrying data to or from the package 910, can be provided in rows 928 adjacent to a periphery of the substrate 920.

Figure 13:
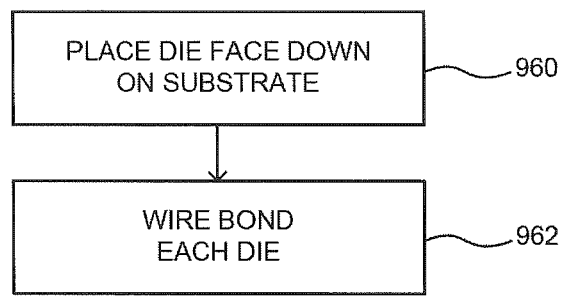
FIG. 13 depicts a method of manufacturing the microelectronic package illustrated in accordance with FIGS. 14-16 in accordance with an embodiment of the invention.

FIG. 13 depicts a method of manufacturing the microelectronic package 910. As depicted therein, in block 960 each of the four die (microelectronic elements 930) in the package can be obtained from one single diced wafer and placed face down facing surface 921 of the substrate 920 in processing performed all at one manufacturing station of a high volume manufacturing assembly line. Thereafter, in block 962, wire bonds 940 can be formed which couple each of the die 930 with corresponding conductive structure of the substrate 920.

Figure 17:
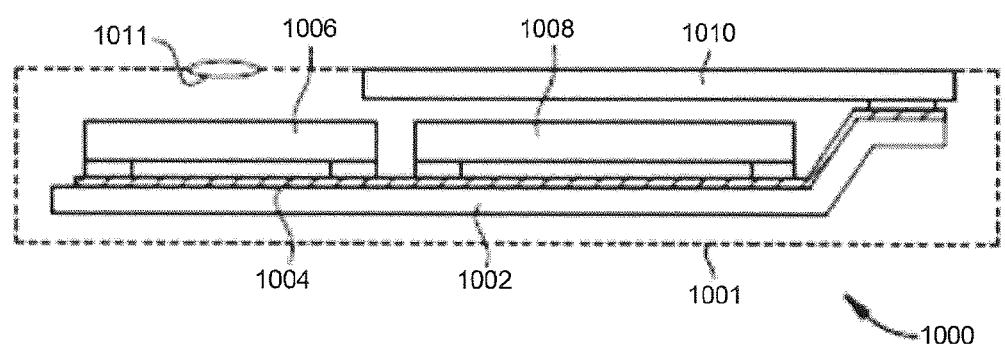
FIG. 17 is a schematic diagram illustrating a system in which microelectronic packages can be utilized according to an embodiment of the invention.

The structures discussed above can be utilized in construction of diverse electronic systems. For example, a system 1000 in accordance with a further embodiment of the invention includes a structure 1006 as described above in conjunction with other electronic components 1008 and 1010. In the example depicted, component 1008 is a semiconductor chip whereas component 1010 is a display screen, but any other components can be used. Of course, although only two additional components are depicted in FIG. 17 for clarity of illustration, the system may include any number of such components. The structure 1006 as described above may be, for example, any of the microelectronic packages discussed above. Structure 1006 and components 1008 and 1010 are mounted in a common housing 1001, schematically depicted in broken lines, and are electrically interconnected with one another as necessary to form the desired circuit. In the exemplary system shown, the system includes a circuit panel 1002 such as a flexible printed circuit board, and the circuit panel includes numerous conductors 1004, of which only one is depicted in FIG. 17, interconnecting the components with one another. However, this is merely exemplary; any suitable structure for making electrical connections can be used. The housing 1001 is depicted as a portable housing of the type usable, for example, in a smart phone or other cellular telephone, tablet computer, or notebook computer, for example, and screen 1010 is exposed at the surface of the housing. Where structure 1006 includes a light-sensitive element such as an imaging chip, a lens 1011 or other optical device also may be provided for routing light to the structure. Again, the simplified system shown in FIG. 17 is merely exemplary; other systems, including systems commonly regarded as fixed structures, such as desktop computers, routers and the like can be made using the structures discussed above.

In variations of the embodiments described above it is possible for the contacts of microelectronic elements to not be disposed in central regions of the surfaces thereof. Rather, the contacts may be disposed in one or more rows adjacent an edge of such microelectronic element. In another variation, the contacts of a microelectronic element can be disposed adjacent two opposed edges of such microelectronic element. In yet another variation, the contacts of a microelectronic element can be disposed adjacent any two edges, or be disposed adjacent more than two edges of such microelectronic element. In such cases, locations of apertures in the substrate can be modified to correspond to such locations of the contacts disposed adjacent such edge or edges of the microelectronic element.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of manufacturing a microelectronic package, comprising:
   (a) attaching first major surfaces of a first microelectronic element and a spacer element, respectively, to a first surface of a substrate such that a plurality of contacts at the first major surface of the first microelectronic element are aligned with a first opening extending through the substrate;
   (b) then attaching a second microelectronic element atop second major surfaces of the first microelectronic element and the spacer element, respectively, the second major surfaces opposite the first major surfaces, such that a plurality of contacts on a surface of the second microelectronic element facing the substrate are disposed beyond an edge of the first microelectronic element and are aligned with a second opening in the substrate other than the first opening; and
   (c) forming electrical connections between the first microelectronic element and the substrate and between the second microelectronic element and the substrate,
   wherein steps (a) and (b) include transferring the first and second microelectronic elements from first and second positions of a single diced wafer to respective positions overlying the first surface of the substrate, wherein the first and second positions of the diced wafer are selected so as to maximize compound speed bin yield of the microelectronic package when performing steps (a), (b) and (c) in high volume manufacturing.

2. The method of claim 1, wherein the contacts of the first microelectronic element are aligned only with the first opening and second die contacts are aligned only with the second opening.

3. The method of claim 2, wherein the contacts of the second microelectronic element are exposed at a central region of the first major surface thereof, wherein a majority of the contacts of the second microelectronic element are disposed within one or two columns of the contacts of the second microelectronic element, each such column extending in a direction parallel to the first and second edges of the second microelectronic element.

4. The method of claim 1, wherein the first and second microelectronic elements have memory storage array function.

5. The method of claim 1, wherein step (c) includes inserting a tip of a bonding tool through the first opening to bond a plurality of first leads only to the contacts of the first microelectronic element, and inserting the tip of a bonding tool through the second opening to bond a plurality of second leads only to the contacts of the second microelectronic element.

6. The method as claimed in claim 5, wherein the first leads are first wire bonds and the second leads are second wire bonds.

7. The method as claimed in claim 5, wherein at least portions of the first and second openings are spaced apart from one another by dielectric material of the substrate.

8. The method as claimed in claim 7, wherein the first opening does not adjoin the second opening.

9. The method as claimed in claimed in claim 5, wherein the first and second openings are portions of a continuous opening extending through the substrate.

10. The method of claim 1, wherein the second microelectronic element has first and second parallel opposite edges and the contacts of the second microelectronic element are exposed at a central region of the first major surface thereof, wherein a majority of the contacts of the second microelectronic element are disposed within one or two rows of the contacts of the second microelectronic element, each row of contacts extending in a direction parallel to the first and second edges of the second microelectronic element.

11. The method of claim 1, wherein steps (a) and (b) include transferring the first and second microelectronic elements from closely neighboring positions of the diced wafer.

12. The method of claim 11, wherein the second microelectronic element is transferred from a position immediately adjacent to the position of the first microelectronic element on the single diced wafer.

13. The method of claim 1, wherein step (a) includes attaching the first major surfaces of the first microelectronic element and the spacer element to the surface of the substrate with an adhesive bonding the first major surfaces thereof to the surface of the substrate.

14. The method of claim 13, wherein step (b) includes attaching the major surface of the second microelectronic element atop the second major surfaces of the first microelectronic element and the spacer element with an adhesive overlying the second major surface of the first microelectronic element at a time of attaching the first major surface of the second microelectronic element thereto.

15. The method of claim 1, further comprising, prior to performing step (a), advancing a continuous tape to a station of an assembly line, the continuous tape comprising a plurality of the substrates adjoining one another at at least first edges thereof which are oriented in a first direction, and then applying an adhesive to the surface of at least one of the substrates, wherein the attaching in step (a) is performed using the applied adhesive.

16. The method as claimed in claim 1, wherein step (b) includes applying a second adhesive atop the second major surface of at least the first microelectronic element and then placing the second microelectronic element atop the second major surfaces of the first microelectronic element and the spacer element.

17. The method of claim 1, wherein step (c) includes depositing a conductive material to electrically connect the contacts of at least one of the first or second microelectronic elements with corresponding contacts on the substrate.

18. The method of claim 1, further comprising,
prior to performing step (a), positioning a first element comprising a plurality of substrates each attached to one another at at least first and second peripheral edges thereof such that a first substrate thereof is positioned at a first station of an assembly line,
wherein step (a) includes transferring at least the first microelectronic element to the position atop the first substrate when the first substrate is positioned at the first station,
and then positioning the first element such that the first substrate is positioned at a second station of the assembly line,
and then applying an adhesive atop the second major surfaces of the first microelectronic element and the spacer element, respectively;
then repositioning the first element such that the first substrate is repositioned at the first station, wherein step (b) includes then transferring at least the second microelectronic element to the position atop the second major surfaces of the first microelectronic element and the spacer element.

19. The method of claim 18, wherein the first element includes a continuous indexable dielectric tape comprising the plurality of substrates and
wherein the step of positioning the first element prior to performing step (a) is performed by indexing the dielectric tape in a first direction, and
the step of positioning the first element after applying the adhesive is performed by indexing the dielectric tape in at least one of the first direction or a second direction opposite to the first direction.

20. The method of claim 19, wherein the step of positioning the first element such that the first substrate is positioned at the second station is performed by indexing the dielectric tape in the first direction, and
the step of positioning the first element after applying the adhesive is performed by indexing the dielectric tape in the second direction.

21. The method of claim 19, wherein the step of positioning the first element such that the first substrate is positioned at the second station is performed by indexing the dielectric tape in the second direction, and
the step of positioning the element after applying the adhesive such that the first substrate is positioned again at the first station is performed by indexing the dielectric tape in the first direction.

22. The method of claim 1, further comprising, prior to performing step (a), moving at least one of a continuous tape comprising a plurality of substrates attached to one another at at least first edges thereof, or a first station of an assembly line relative to one another such that a first substrate thereof is positioned at the first station, wherein step (a) includes transferring the first microelectronic element and the spacer element to respective positions atop the first substrate when the first substrate is positioned at the first station,
prior to performing step (b), advancing the continuous tape such that the first substrate with the first microelectronic element and the spacer element attached thereto arrives at a second station of the assembly line at a location different from the first station,
then applying an adhesive to the second major surfaces of the first microelectronic element and the spacer element, and
then moving at least one of the continuous tape or the first station relative to one another such that the first substrate thereof arrives again at the first station, wherein step (b)

includes transferring the second microelectronic element to its position atop the first substrate when the first substrate is positioned at the first station.

23. The method of claim 22 wherein the substrate includes a B-stage material exposed at the major surface, wherein step (a) is performed by placing the first microelectronic element and the spacer element on the major surface of the substrate, and the method further comprises curing the B-stage material after performing at least one of steps (a) and (b).

24. The method of claim 22 wherein prior to transferring the first and second microelectronic elements from the first and second positions to their respective positions overlying the surface of the substrate, an adhesive is disposed between the major surfaces of the first and second microelectronic elements, respectively and a handling element, wherein the first and second microelectronic elements are adhesively attached to the substrate with the adhesive.

25. A method, comprising:
(a) attaching a first major surface of a first microelectronic element to a first surface of a substrate such that a plurality of contacts at the first major surface of the first microelectronic element are aligned with a first opening extending through the substrate;
(b) attaching a second microelectronic element atop a second major surface of the first microelectronic element, the second major surface opposite the first major surface, such that a plurality of contacts at a surface of the second microelectronic element facing the substrate are disposed beyond an edge of the first microelectronic element and are aligned with a second opening in the substrate other than the first opening;
(c) assembling a third microelectronic element and a fourth microelectronic element with the first and second microelectronic elements to respective positions overlying the surface of the substrate such that the first and third microelectronic elements are each adjacent to the major surface of the substrate and are spaced apart from one another, and each of the second and fourth microelectronic elements partially overlies the first and third microelectronic elements and has contacts exposed beyond edges of the first and third microelectronic elements, and
(c) forming electrical connections between the first microelectronic element and the substrate, between the second microelectronic element and the substrate, between the third microelectronic element and the substrate and between the fourth microelectronic element and the substrate, wherein steps (a), (b), and (c) include transferring the first, second, third, and fourth microelectronic elements from first, second, third, and fourth positions of a single diced wafer to respective positions overlying the first surface of the substrate, wherein the positions of the diced wafer are selected so as to maximize compound speed bin yield of the microelectronic package when performing steps (a), (b) and (c) in high volume manufacturing.

26. A method of manufacturing a microelectronic package, comprising:
(a) adhesively attaching major surfaces of first, second, third and fourth microelectronic elements to a major surface of a first substrate, such that each of the microelectronic elements is spaced apart from all others of the first, second, third and fourth microelectronic elements in at least one direction parallel to the major surface,
wherein step (a) includes transferring the first, second, third and fourth microelectronic elements from original positions of a single wafer; and
(b) after step (a), forming electrical connections between the first, second, third and fourth microelectronic elements and the first substrate;
wherein steps (a) and (b) include transferring the microelectronic elements from positions of a single diced wafer to respective attachment positions of the major surface of the substrate, wherein the positions of the diced wafer are selected so as to maximize compound speed bin yield of the microelectronic package when performing steps (a) and (b) in high volume manufacturing.

27. The method of claim 26, wherein the first substrate comprises a continuous tape which includes a plurality of the substrates attached to one another at peripheral edges thereof, the method further comprising:
after step (b), severing the first substrate with the microelectronic elements attached thereto from the continuous tape to provide an individual microelectronic package.

28. The method of claim 26, wherein each of the first, second, third and fourth microelectronic elements has a column of contacts exposed at its respective major surface are arranged along a respective axes selected from first, second, third, and fourth axes, wherein the first and third axes are parallel to one another, and the second and fourth axes are parallel to one another and transverse to the first and third axes.

* * * * *